(12) United States Patent
Philipson et al.

(10) Patent No.: US 10,866,438 B2
(45) Date of Patent: Dec. 15, 2020

(54) FARADAY-BASED POLARIZATION SCRAMBLER

(71) Applicant: VIAVI SOLUTIONS INC., San Jose, CA (US)

(72) Inventors: Joshua Philipson, Ottawa (CA); Christopher Russell Wagner, Kanata (CA)

(73) Assignee: VIAVI SOLUTIONS INC., San Jose, CA (US)

( * ) Notice: Subject to any disclaimer, the term of this patent is extended or adjusted under 35 U.S.C. 154(b) by 0 days.

(21) Appl. No.: 16/351,131

(22) Filed: Mar. 12, 2019

(65) Prior Publication Data

US 2020/0292852 A1   Sep. 17, 2020

(51) Int. Cl.
  *G02F 1/01* (2006.01)
  *G02F 1/09* (2006.01)
  *G01R 15/24* (2006.01)

(52) U.S. Cl.
  CPC .......... *G02F 1/0136* (2013.01); *G01R 15/246* (2013.01); *G02F 1/09* (2013.01); *G02F 2001/0139* (2013.01)

(58) Field of Classification Search
  CPC .............................................. G02F 2001/0139
  See application file for complete search history.

(56) References Cited

U.S. PATENT DOCUMENTS

| | | | | |
|---|---|---|---|---|
| 3,756,690 A * | 9/1973 | Borrelli | .................. | G02F 1/095 385/1 |
| 6,618,513 B2 * | 9/2003 | Evankow, Jr. | ........ | G02F 1/0134 359/489.15 |
| 7,642,504 B2 * | 1/2010 | Abrate | .................. | G01D 5/344 250/227.14 |
| 8,331,024 B1 * | 12/2012 | Illing | .................... | G02F 1/0136 359/237 |
| 8,624,579 B2 * | 1/2014 | Chamorovskiy | .... | G01R 15/246 250/227.17 |
| 10,067,290 B2 * | 9/2018 | Wu | ...................... | G02B 6/2766 |

OTHER PUBLICATIONS

J. Prat et al., "Dispersion-Shifted Fiber Polarization Scrambler Based on Faraday Effect", IEEE Photonics Technology Letters, vol. 11, No. 7, Jul. 1999, pp. 845-847.

* cited by examiner

*Primary Examiner* — Rhonda S Peace
(74) *Attorney, Agent, or Firm* — Mannava & Kang, P.C.

(57) ABSTRACT

A Faraday-based polarization scrambler is disclosed. The Faraday-based polarization scrambler may comprise a first toroidal assembly. The first toroidal assembly may include an optical fiber that is looped to form a first looped portion, and a first electrical wire that coils around the first looped portion to form a first toroidal configuration. In some examples, the first electrical wire may be connected to a voltage source and carries a current to form a magnetic field within the first toroidal configuration. In some examples, there may be additional toroidal assemblies provided to the Faraday-based polarization scrambler. One or more of these toroidal assemblies may create an actuation field to effect modulation for polarization scrambling and emulation that mitigates polarization-dependent effects.

18 Claims, 5 Drawing Sheets

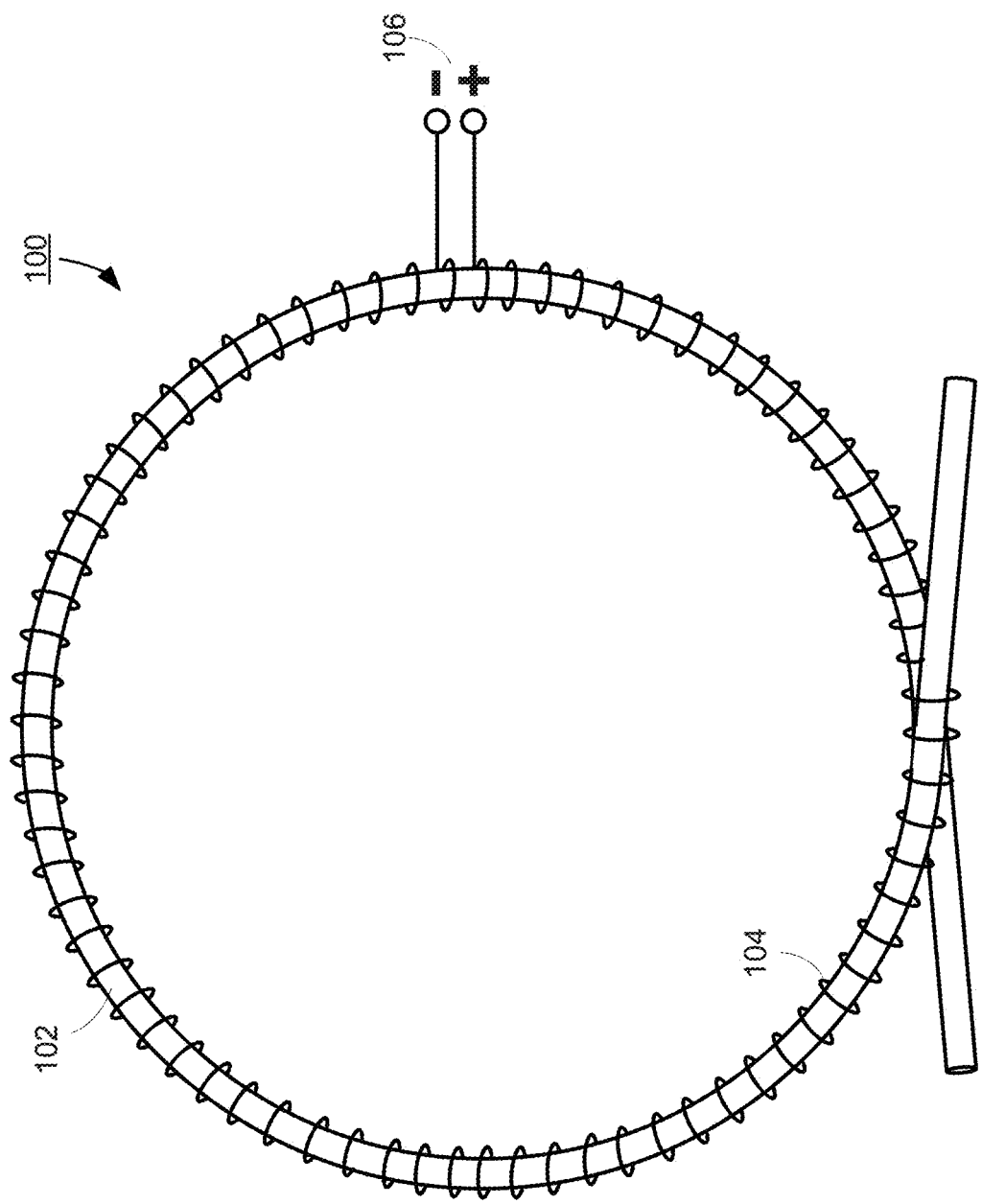

400

```
Providing a first toroidal assembly comprising: an optical fiber that is
looped to form a first looped portion; and a first electrical wire that coils
around the first looped portion to form a first toroidal configuration,
wherein the first electrical wire is connected to a voltage source and
carries a current to form a magnetic field within the toroidal configuration
401
```

↓

```
Providing one or more additional toroidal assemblies connected to the
first toroidal assembly via the optical fiber, each of the additional toroidal
assemblies comprising: a looped portion comprising the optical fiber; and
an electrical wire that coils around the looped portion to form an
additional toroidal configuration, wherein the electrical wire is connected
to a voltage source and carries a current to form a magnetic field within
the additional toroidal configuration
402
```

FIG. 4

FARADAY-BASED POLARIZATION SCRAMBLER

TECHNICAL FIELD

This patent application is directed to optical measurements in telecommunication networks, and more specifically, to a Faraday-based polarization scrambler for mitigating polarization dependent loss (PDL) and other polarization-dependent and related effects.

BACKGROUND

Polarization-dependent effects often have undesirable effects in fiber-optic systems. These adverse effects may include polarization-dependent loss (PDL) in various optical components and devices. Polarization may be uncontrolled and allowed to passively drift in a network, or it may be controlled deliberately in certain cases, say, for test and measurement. When controlled, it is generally controlled using controllers or scramblers. A polarization controller is typically used when a fixed polarization state is desired or a set of desired states over some time duration. A polarization scrambler, on the other hand, is generally used when the average polarization state is desired. The latter may be achieved in a number of ways, but the present work is most interested in the class of scramblers referred to as a 'temporal-depolarizers,' which involves creation of rapidly time-varying state-of-polarization (SOP), effectively scrambling the light over some defined time-interval. In other words, such a polarization scrambler employs a process of varying polarization of light so that an average polarization over time is randomized.

Conventional polarization scramblers are generally based on several technologies. Among the more popular polarization scramblers are fiber-based scramblers (e.g., resonant fiber-coil- and fiber-squeezer-based systems) and electro-optic based scramblers (e.g., LiNbO3). A technical problem with these traditional polarization scramblers is that they can be rather expensive to manufacture and typically offer only limited or minimum range of control. The challenge posed is to find a polarization scrambling technology that is high-speed, low-loss, low cost, and rate-tunable, has stable-insertion-loss, and offers defeatable polarization scrambling. These challenges occur in modern networks where polarization-dependent effects can become quite rampant and difficult to mitigate, or in test & measurement systems, where requirements for certain vendors or systems-manufacturers may be rather stringent.

As a result, an in-fiber polarization scrambler that utilizes a Faraday-based configuration and an efficient minimalist design may be helpful in mitigating polarization-dependent and related effects and overcoming shortcomings of conventional technologies.

BRIEF DESCRIPTION OF DRAWINGS

Features of the present disclosure are illustrated by way of example and not limited in the following Figure(s), in which like numerals indicate like elements, in which:

FIG. 1 illustrates a polarization scrambler using Faraday-based configuration, according to an example;

FIG. 4 illustrates a flow chart of a method for using a polarization scrambler using Faraday-based configuration, according to an example.

DETAILED DESCRIPTION

Figure 2A:
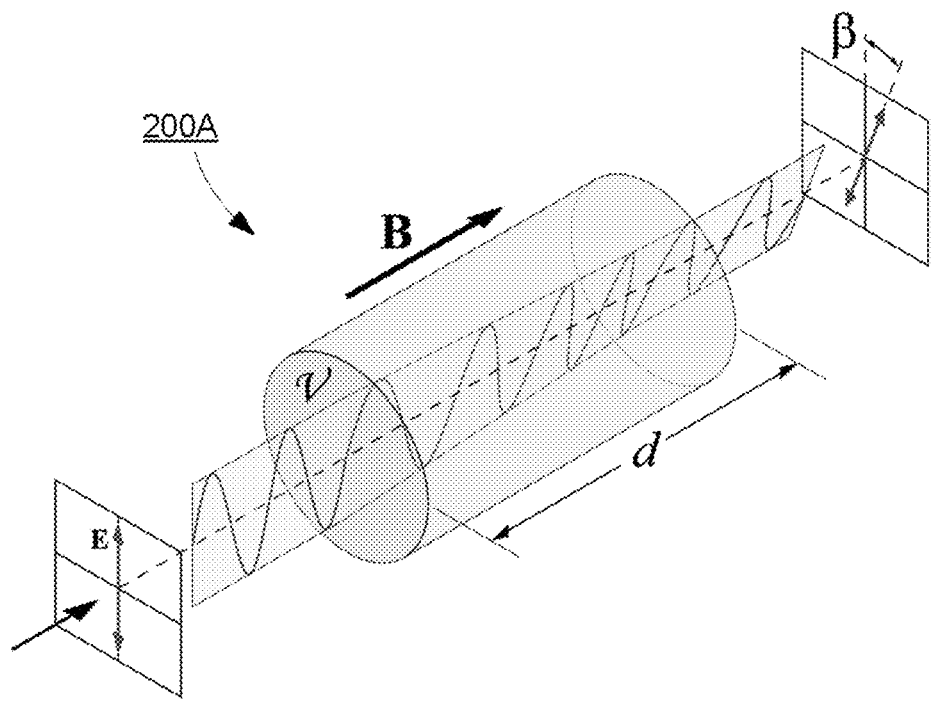
FIG. 2A illustrates polarization rotation due to a Faraday effect induced in a fiber by an impressed magnetic flux density B, according to an example.

For simplicity and illustrative purposes, the present disclosure is described by referring mainly to examples and embodiments thereof. In the following description, numerous specific details are set forth in order to provide a thorough understanding of the present disclosure. It will be readily apparent, however, that the present disclosure may be practiced without limitation to these specific details. In other instances, some methods and structures readily understood by one of ordinary skill in the art have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

As described above, polarization-dependent effects often have undesirable effects in fiber-optic systems. These adverse effects may include polarization-dependent loss (PDL) in various optical components and devices. These effects may arise, for example, in systems that variously measure a quantities maximum polarization-dependent variation, or alternatively, a quantities average value over all polarization states.

Polarization is a fundamental property of light and describes vibrations of a transverse optical wave. In classical physics, light is an electromagnetic wave. Polarization is defined in terms of pattern traced out in the transverse plane by the tip of an electric field vector as a function of time.

For unpolarized light the electric field vector, may fluctuate randomly in the transverse plane, along the direction of light beam propagation. Therefore, on average, no direction may be especially favored. The rate of the fluctuation may be so fast that a detector cannot discern state of polarization (SOP) at any instant of time. In such a state, the light may be effectively considered unpolarized. A light beam may generally be considered to consist of partially polarized or fully polarized light. Degree of Polarization (DOP) is typically used to describe how much in the total light intensity is polarized. For totally polarized light, DOP may be one. On the other hand, for completely unpolarized light, DOP may be zero.

The polarization of light beams may an important factor in high-speed optical communication network system design. Output light from most high-performance lasers used in long-haul optical communication systems may be highly polarized light sources, and components may themselves may have polarization sensitive responses. As the bit rate increases, fiber optic communication systems may become increasingly sensitive to polarization related impairments, which are usually sought to be minimized. Such impairments may include polarization mode dispersion (PMD) in optical fibers, polarization dependent loss (PDL) in passive optical components, polarization dependent modulation (PDM) in electro-optic modulators, polarization dependent gain (PDG) in optical amplifiers, polarization dependent center wavelength (PDW) in WDM filters, polarization dependent response (PDR) in receivers, polarization dependent sensitivity (PDS) in sensors and coherent communication systems, and other adverse or related effects.

Polarization is generally manipulated using controllers or scramblers. A polarization controller may be used when a fixed polarization state is desired. A polarization scrambler, on the other hand, may be used when one needs to measure the average performance across all polarizations. In particular, temporal scrambling may be achieved by inducing high frequency SOP (state-of-polarization) changes. In other words, a polarization scrambler may employ a process of varying the polarization of light so that an average polarization over time is randomized.

Polarization scrambling, in particular, may be used to mitigate polarization related impairments. A polarization scrambler may "scrambled" polarization of light if the SOP of a totally polarized light is made to vary randomly at a relatively low rate. At any instant of time, the SOP may be well defined and DOP may be close to 1. However, on a time average, DOP may be close to zero. Therefore, the DOP of a scrambled light may depend on the average time or the detection bandwidth of a detector.

As described above, conventional polarization scramblers may be generally based on several technologies. Among the more popular polarization scramblers are fiber-based scramblers (e.g., resonant fiber-coil- and fiber-squeezer-based systems) and electro-optic based scramblers (e.g., LiNbO3). Each of these polarization scramblers may actively change the SOP using a polarization modulation method. Fiber-based scramblers may be based on actuating a piezoelectric stack or cylinder with fiber-windings to create time-varying birefringence. Electro-optic scramblers may be based on LiNbO3 to create time-varying polarization scrambling and emulation. Performance of a polarization scrambler may generally be measured by the degree of polarization of the scrambled light over a certain period of time and the uniformity of the SOP Poincare sphere coverage. In practice, the wavelength sensitivity and temperature sensitivity of the performance of the scrambler may also be important for real world applications.

A technical problem with these traditional polarization scramblers is that they can be rather expensive to manufacture, configure, or operate, and typically offer only limited or minimum range of control. These challenges are exacerbated in high-speed, in-fiber, defeatable polarization scramblers, where polarization-dependent effects can become quite rampant and difficult to mitigate. It should be appreciated that "defeatable," as used herein, may refer to an effect that can be activated or deactivated.

Accordingly, an in-fiber polarization scrambler that utilizes a Faraday-based configuration and an efficient minimalist design may help mitigating polarization-dependent and other related effects in a low-loss, cost-effective way.

FIG. 1 illustrates a polarization scrambler 100 using Faraday-based configuration, according to an example. As shown, the polarization scrambler 100 may be an-in-fiber polarization scrambler. In some examples, the polarization scrambler 100 may include an optical fiber 102 and electrical wires 104 where voltage 106 is applied and carry a current. The optical fiber 102 may be looped (one or more times) such that the electrical wires 104 coil the looped portion of the optical fiber with N turns. This configuration may resemble a toroidal geometry.

It should be appreciated that a toroid geometry may exhibit more inductance, for a given number of N turns, than a solenoid with a core of the same material and similar size. This makes it possible to construct high-inductance coils of reasonable physical size and mass with greater efficiency of design. Toroidal coils of a given inductance may also carry more current than a solenoidal coil of similar size because larger-diameter wires may be used with a total amount of wiring may be less, which in turn may reduce resistance. Furthermore, in a toroid, virtually all magnetic flux may be contained in the core material, in this case the looped portions of the optical fiber 102. This is because the core may have generally have no "ends" from which flux might leak off. Confinement of the flux may prevent external magnetic fields from affecting behavior of toroid, and may also prevent the magnetic field in the toroid from affecting other components in a circuit.

This toroidal geometry in the polarization scrambler 100 may therefore leverage a Faraday effect with regards to polarization-based rotation. For example, FIG. 2A illustrates polarization rotation due to a Faraday effect induced in a fiber by an impressed magnetic flux density B, according to an example. As shown, the relation between the angle of rotation of the polarization and the magnetic field in a transparent material, such as an optical fiber, may be expressed as:

$$\beta = \nu B d,$$

where $\beta$ may represent angle of rotation, B may represent magnetic flux density in a direction of propagation, d may represent length of the path where the light and magnetic field interact, and where v may represent the Verdet constant for the material.

Here, a positive Verdet constant may corresponds to L-rotation (anticlockwise) when the direction of propagation is parallel to the magnetic field and to R-rotation (clockwise) when the direction of propagation is anti-parallel. Thus, if a ray of light is passed through a material and reflected back through it, the rotation may double.

Thus, the toroidal geometry of the polarization scrambler 100 of FIG. 1 may allow the Faraday effect to work when the e-field is launched axially along the optical fiber, which may create an actuation field to effect a modulation on the Faraday constant.

It should be appreciated that the optical fiber 102 may be provided at various lengths and used to create any number of loops or looped portions. These factors, as well as electrical wire turns, spacing, loop radius, thickness of optical fiber, thickness of electrical wire, materials, coatings, etc. may affect intensity of a create electrical or magnetic field. Therefore, depending on application, these and other factors may be adjusted for optimal results.

Figure 2B:
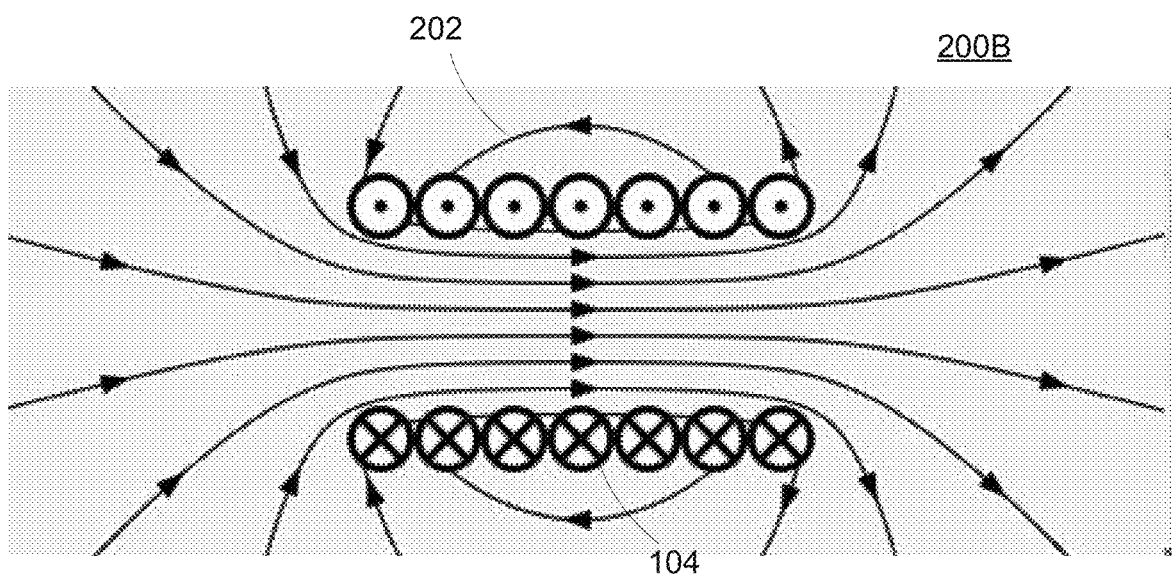
FIG. 2B illustrates the magnetic field in a solenoid configuration, according to an example.

FIG. 2B illustrates a magnetic field in a solenoid configuration, according to an example. It should be noted that FIG. 2 is used to help show flux lines concentrating interior to the solenoid to help illustrate how this might work in a toroid since the same principle holds. For example, flux lines may concentrate inside a toroid structure, where the fiber may be located, and the reason for electrical windings. As shown in FIG. 2B, all the loops of electrical wire 104 that make up a toroid help contribute to magnetic field in the same direction inside the toroid. Now, if the number of turns N is large, the current may produce magnetic lines of flux 202 that are concentric circles confined to the toroid. Such a toroidal configuration or assembly may be relatively inexpensive and capable of high-speed modulations on the first via high-speed current switching, which may be used to "scramble" polarization.

In some examples, other configurations or arrangements may also be provided. For example, FIGS. 3A-3C illustrate a polarization scrambler in a concatenated configuration, according to an example.

Figure 3A:
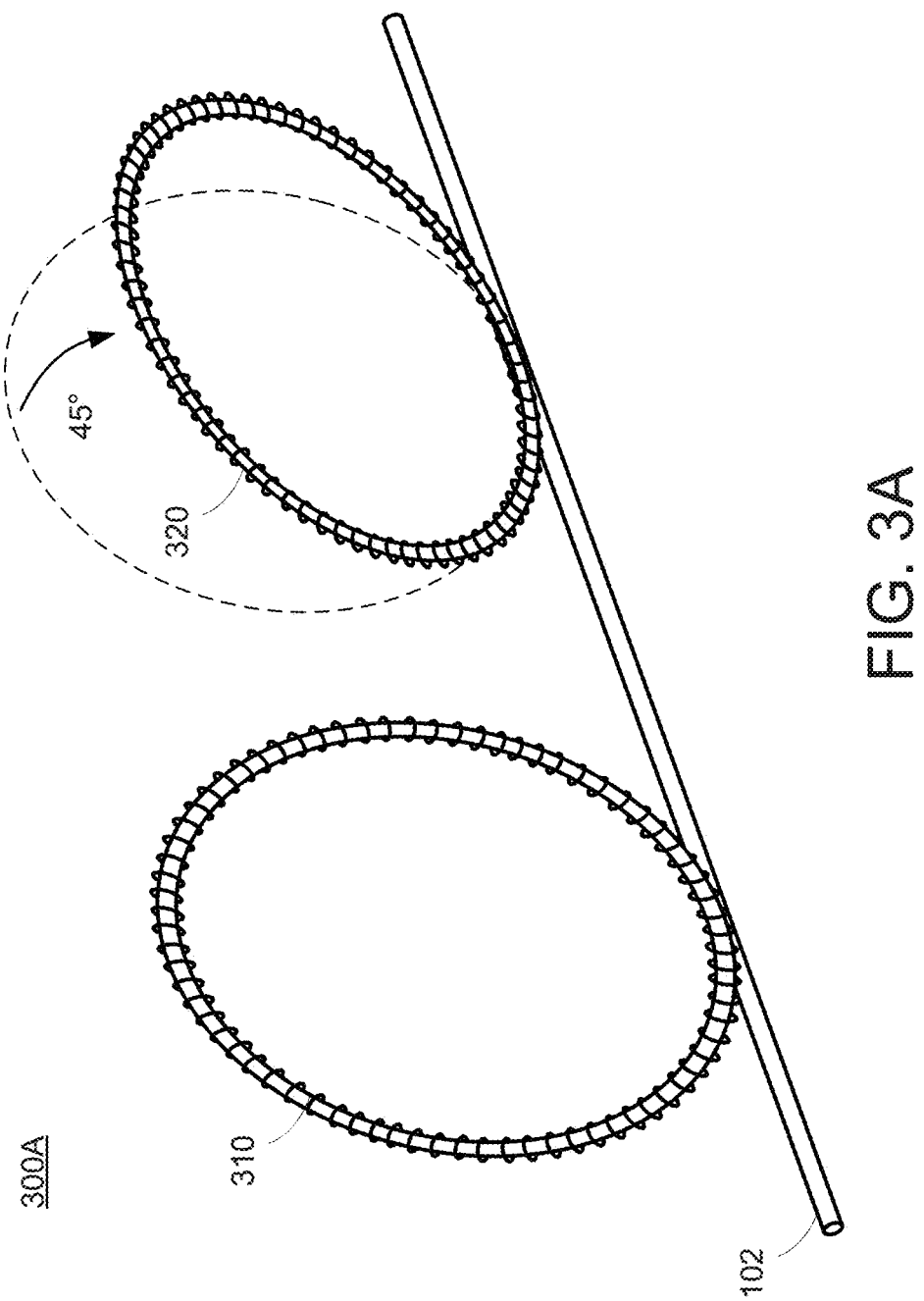
FIG. 3A illustrates a planar view of a polarization scrambler in a concatenated and offset configuration, according to an example.

FIG. 3A illustrates a planar view of a polarization scrambler 300A in a concatenated and offset configuration, according to an example. As shown, the polarization scrambler 300A may include an optical fiber 102, a toroidal assembly #1 310, and toroidal assembly #2 320. In some examples, toroidal assembly #2 320 may be offset (e.g., by 45°) along the plane of the optical fiber 102. Such an offset may increase electro-optic effects. In such a concatenated and offset configuration, the polarization scrambler 300A may allow increased control for time-varying polarization scrambling and emulation, not to mentioned desired SOP trajectories.

Figure 3B:
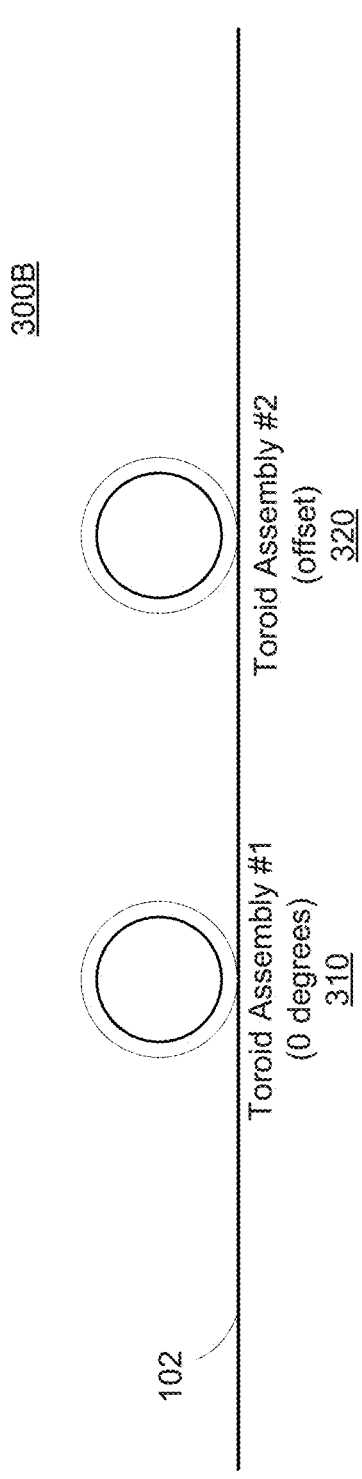
FIG. 3B illustrates a polarization scrambler in a concatenated configuration, according to an example.

FIG. 3B illustrates a polarization scrambler 300B in a concatenated configuration, according to an example. The polarization scrambler 300B may be similar to the polarization scrambler 300A of FIG. 3A but depicted from a side or linear view.

Figure 3C:
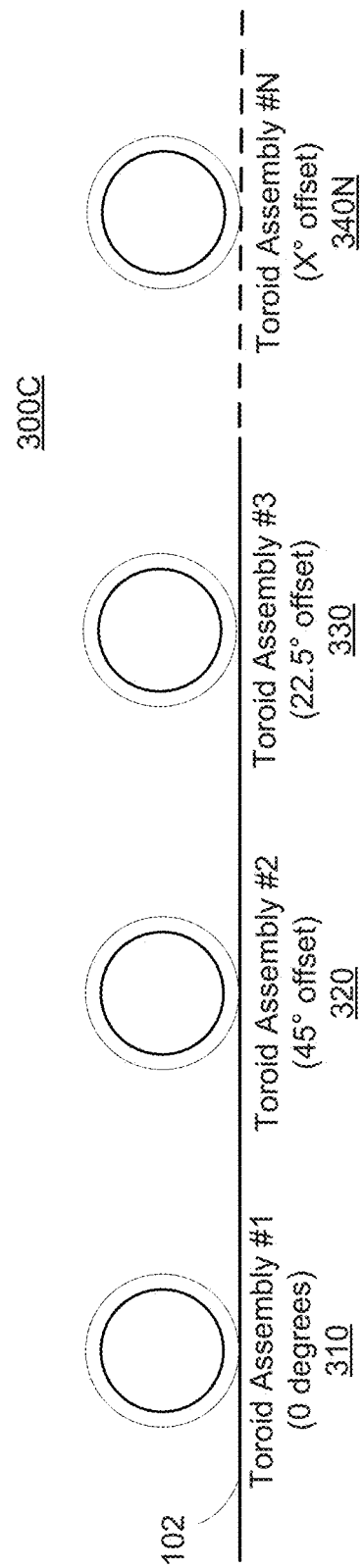
FIG. 3C illustrates a polarization scrambler in a concatenated configuration, according to an example.

FIG. 3C illustrates a polarization scrambler 300C in a concatenated configuration, according to an example. The polarization scrambler 300C may be similar to the polarization scrambler 300B of FIG. 3B but may expand on the number of toroidal assemblies used. As shown, the polarization scrambler 300C may include an optical fiber 102, toroidal assembly #1 310, toroidal assembly #2 320, and toroidal assembly #3 330. In some examples, toroidal assembly #2 320 may be offset (e.g., by 45°) along the plane of the optical fiber 102. Toroidal assembly #3 330 may also be further offset (e.g., by 22.5°). As depicted, there may be N number of toroidal assemblies, each offset by X degrees.

While examples described herein are directed to configurations as shown, it should be appreciated that any number of variations and configurations may be provided. It should be appreciated that the various stages of offsets in an inclination angle may be so ensure that the polarization scrambler 300C may have a maximum effect. As is the concern with any such polarization scrambler, an input SOP may be coincidently be aligned to an Eigen-axis of one of the stages offsets, which may result in having no effect on the SOP. Thus, but concatenating out-of-plane with multiple toroidal assemblies, such concerns may be obviated.

FIG. 4 illustrates a flow chart of a method 400 for using a polarization scrambler. The method 500 is provided by way of example, as there may be a variety of ways to carry out the method described herein. Although the method 400 is primarily described as being performed by the polarization scrambler 100, 300A, 300B, and/or 300C as depicted in FIGS. 1 and 3A-3C, the method 400 may be executed or otherwise performed by one or more processing components of the polarization scrambler 100, 300A, 300B, and/or 300C, or by another system or a combination of systems. Each block shown in FIG. 4 may further represent one or more processes, methods, or subroutines, and one or more of the blocks may include machine readable instructions stored on a non-transitory computer readable medium and executed by a processor or other type of processing circuit to perform one or more operations described herein.

At block 401, a first toroidal assembly may be provided. In some examples the first toroidal assembly may include an optical fiber that is looped to form a first looped portion. The first toroidal assembly may also include a first electrical wire that coils around the first looped portion to form a first toroidal configuration. It should be appreciated that the first electrical wire may be connected to a voltage source and may carry a current to form a magnetic field within the first toroidal configuration.

In some examples, the optical fiber may transmit light from a polarized light source. Also, the first looped portion may include one or a plurality of optical fiber loops.

At block 402, one or more toroidal assembly may be provided. The one or more additional toroidal assemblies connected to the first toroidal assembly via the optical fiber. In some examples, each of the additional toroidal assemblies may comprise a looped portion comprising the optical fiber. Each of the additional toroidal assemblies may also include an electrical wire that coils around the looped portion to form an additional toroidal configuration. In some examples, the electrical wire may be connected to a voltage source and may carry a current to form a magnetic field within the additional toroidal configuration.

It should be appreciated that each of the additional toroidal assemblies may be offset from each other and from the first toroidal assembly. In some examples, the offset may be determined by the following:

$$\text{Offset} = 90 \times (\tfrac{1}{2})^N,$$

where N is an integer that represents each additional toroidal assembly, and where offset is measured in degrees from a plane of the optical fiber. For example, if there is one (N=1) additional toroid assemblies provided in the polarization scrambler, the offset may be 45 degrees. If there are two (N=2) additional toroid assemblies provided in the polarization scrambler, the offset may be 22.5 degrees.

It should be appreciated that the Faraday-based polarization scrambler may mitigate polarization-dependent effects by leveraging Faraday effects to synthesize or emulate desired state of polarization (SOP) trajectories. The aforementioned offsets of the toroidal assemblies may be to obviate any incidental assembly alignment to an eigen-axis that results in having no effect on the SOP.

It should also be appreciated that the polarization scrambler, as described herein, may also include or communicate with other components not shown. For example, these may include external processors, counters, analyzers, computing devices, and other measuring devices or systems. This may also include middleware (not shown) as well. The middleware may include software hosted by one or more servers or devices. Furthermore, it should be appreciated that some of the middleware or servers may or may not be needed to achieve functionality. Other types of servers, middleware, systems, platforms, and applications not shown may also be provided at the back-end to facilitate the features and functionalities of the testing and measurement system.

Moreover, single components may be provided as multiple components, and vice versa, to perform the functions and features described herein. It should be appreciated that the components of the system described herein may operate in partial or full capacity, or it may be removed entirely. It should also be appreciated that analytics and processing techniques described herein with respect to the polarization scrambler, for example, may also be performed partially or in full by other various components of the overall system.

It should be appreciated that data stores may also be provided to the apparatuses, systems, and methods described herein, and may include volatile and/or nonvolatile data storage that may store data and software or firmware including machine-readable instructions. The software or firmware may include subroutines or applications that perform the functions of the polarization scrambler and/or run one or more application that utilize data from the polarization scrambler or other communicatively coupled system.

The various components, circuits, elements, components, and interfaces, may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

Although examples are directed to a polarization scrambler for test and measurement systems, it should be appreciated that that polarization scrambler may also be used in other various systems and other implementations. For example, the polarization scramblers and methods, as described herein, may have numerous applications in optical communication networks and fiber sensor systems as well. In some examples, a polarization scrambler may be used at the transmitter side to minimize polarization dependent gain (PDG) or polarization hole burning of erbium-doped fiber amplifiers (EDFA) in ultra-long haul systems. For this application, scrambling rate may be significantly faster than the inverse of gain recover time constant of the fiber amplifiers (e.g., on the order of 10 kHz).

The polarization scramblers and methods, as described herein, may also be used to assist the monitoring of polarization mode dispersion (PMD) in a wavelength-division multiplexing (WDM) system. Generally speaking, PMD may be monitored by measuring degree of polarization (DOP) of an optical data stream propagated through an optical fiber. A small DOP may indicate a large PMD effect. However, such a measurement may be erroneous if input SOP to a transmission fiber is substantially aligned with a principal state of polarization (PSP) of the fiber. For such a situation, the measured DOP may be large no matter how large a differential group delay (DGD) between the two principal states of polarization is. It should be appreciated that a scrambler at the transmitter side may be used to effectively eliminate such an anomaly. Furthermore, it may enable a polarimeter in a PMD compensator at the receiver side to identify the PSP, which in turn may speed up PMD compensation. Other optical network applications include signal-to-noise ratio monitoring of WDM channels, e.g., if a polarizer is placed after a scrambler.

In some examples, the polarization scramblers and methods, as described herein, may also be used to eliminate the polarization fading of a fiber sensor. In such a system, an envelope of a response curve may be independent of polarization fluctuation. Placing a polarization scrambler, for instance, in front of a polarization sensitive instrument, such as diffraction grating based optical spectrum analyzer, may effectively eliminate or reduce its polarization dependence.

It should be appreciated that the polarization scramblers and methods described herein may also be used to help provide, directly or indirectly, measurements for distance, angle, rotation, speed, position, wavelength, transmissivity, and other related optical measurements. With advantages that include low insertion loss, low back reflection, low residual amplitude and phase modulation, low wavelength and temperature sensitivity, low cost, and small form factor, the polarization scramblers and methods described herein may be beneficial in many original equipment manufacturer (OEM) applications, where they may be readily integrated into various and existing network equipment, fiber sensor systems, test and measurement instruments, or other systems and methods. Ultimately, the systems and methods described herein may minimize bulkiness, increase control and modulation, and reduce costs.

What has been described and illustrated herein are examples of the disclosure along with some variations. The terms, descriptions, and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

The invention claimed is:

1. A Faraday-based polarization scrambler, comprising:
    a first toroidal assembly comprising:
        an optical fiber that is looped to form a first looped portion; and
        a first electrical wire that coils around the first looped portion to form a first toroidal configuration, wherein the first electrical wire is connected to a voltage source and carries a current to form a magnetic field within the first toroidal configuration; and
    a second toroidal assembly connected to the first toroidal assembly via the optical fiber; and
    wherein the first toroidal assembly creates an actuation field to effect modulation for polarization scrambling and emulation that mitigates polarization-dependent effects, and the second toroidal assembly is offset from the first toroidal assembly, wherein the offset is between 0 to 90 degrees from a plane of the optical fiber.

2. The system of claim 1, wherein the optical fiber transmits light from a polarized light source.

3. The system of claim 1, wherein the looped portion comprises a plurality of optical fiber loops.

4. The system of claim 1, wherein the electrical wire coils the looped portion N times, wherein N represents an integer.

5. The system of claim 1, wherein the second toroidal assembly comprises:
    a second looped portion comprising the optical fiber; and
    a second electrical wire that coils around the second looped portion to form a second toroidal configuration, wherein the second electrical wire is connected to a voltage source and carries a current to form a magnetic field within the second toroidal configuration.

6. The system of claim 5, wherein the offset is 45 degrees from a plane of the optical fiber.

7. The system of claim 5, further comprising:
    additional toroidal assemblies connected to the first toroidal assembly and the second toroidal assembly via the optical fiber, each of the additional toroidal assembly comprising:
    a looped portion comprising the optical fiber; and
    an electrical wire that coils around the looped portion to form an additional toroidal configuration, wherein the electrical wire is connected to a voltage source and carries a current to form a magnetic field within the additional toroidal configuration; and
    wherein the additional toroidal assemblies are offset from each other, as well as from the first toroidal assembly and the second toroidal assembly.

8. The system of claim 7, wherein the Faraday-based polarization scrambler mitigates polarization-dependent effects by leveraging Faraday effects to synthesize or emulate desired state of polarization (SOP) trajectories.

9. The system of claim 8, wherein the offsets of the first toroidal assembly, the second toroidal assembly, and additional toroidal assemblies obviate any incidental assembly alignment to an eigen-axis that results in having no effect on the SOP.

10. A method of making Faraday-based polarization scrambler, comprising:
   providing a first toroidal assembly comprising:
      an optical fiber that is looped to form a first looped portion; and
      a first electrical wire that coils around the first looped portion to form a first toroidal configuration, wherein the first electrical wire is connected to a voltage source and carries a current to form a magnetic field within the first toroidal configuration; and
   providing one or more additional toroidal assemblies connected to the first toroidal assembly via the optical fiber,
   wherein the first toroidal assembly creates an actuation field to effect modulation for polarization scrambling and emulation that mitigates polarization-dependent effects, and wherein each of the additional toroidal assemblies are offset from each other, as well as from the first toroidal assembly, wherein the offset is determined by the following:

$$\text{Offset} = 90 \times (\frac{1}{2})^N,$$

where N is an integer that represents each additional toroidal assembly, and where offset is measured in degrees from a plane of the optical fiber.

11. The method of claim 10, wherein each of the additional toroidal assemblies comprises:
   a looped portion comprising the optical fiber; and
   an electrical wire that coils around the looped portion to form an additional toroidal configuration, wherein the electrical wire is connected to a voltage source and carries a current to form a magnetic field within the additional toroidal configuration.

12. The method of claim 11, wherein the Faraday-based polarization scrambler mitigates polarization-dependent effects by leveraging Faraday effects to synthesize or emulate desired state of polarization (SOP) trajectories.

13. The method of claim 11, wherein the offsets of the first toroidal assembly and additional toroidal assemblies obviate any incidental assembly alignment to an eigen-axis that results in having no effect on the SOP.

14. A non-transitory computer-readable storage medium having an executable stored thereon, which when executed instructs a processor to perform the method of claim 11.

15. A method of using Faraday-based polarization scrambler, comprising:
   providing a first toroidal assembly comprising:
      an optical fiber that is looped to form a first looped portion; and
      a first electrical wire that coils around the first looped portion to form a first toroidal configuration, wherein the first electrical wire is connected to a voltage source and carries a current to form a magnetic field within the toroidal configuration; and
   providing one or more additional toroidal assemblies connected to the first toroidal assembly via the optical fiber, each of the additional toroidal assemblies comprising:
      a looped portion comprising the optical fiber; and
      an electrical wire that coils around the looped portion to form an additional toroidal configuration, wherein the electrical wire is connected to a voltage source and carries a current to form a magnetic field within the additional toroidal configuration; and
   wherein each of the additional toroidal assemblies are offset from each other, as well as from the first toroidal assembly, wherein the offset is determined by the following:

$$\text{Offset} = 90 \times (\frac{1}{2})^N,$$

where N is an integer that represents each additional toroidal assembly, and where offset is measured in degrees from a plane of the optical fiber; and
   wherein the first toroidal assembly and the additional toroidal assemblies together create an actuation field to effect modulation for polarization scrambling and emulation that mitigates polarization-dependent effects.

16. The method of claim 15, wherein the Faraday-based polarization scrambler mitigates polarization-dependent effects by leveraging Faraday effects to synthesize or emulate desired state of polarization (SOP) trajectories.

17. The method of claim 15, wherein the offsets of the first toroidal assembly and additional toroidal assemblies obviate any incidental assembly alignment to an eigen-axis that results in having no effect on the SOP.

18. A non-transitory computer-readable storage medium having an executable stored thereon, which when executed instructs a processor to perform the method of claim 15.

* * * * *